(12) United States Patent
Diamond et al.

(10) Patent No.: US 8,629,011 B2
(45) Date of Patent: Jan. 14, 2014

(54) EPITAXIAL SILICON CMOS-MEMS MICROPHONES AND METHOD FOR MANUFACTURING

(75) Inventors: Brett M. Diamond, Pittsburgh, PA (US);
Franz Laermer, Weil der Stadt (DE);
Andrew J. Doller, Sharpsburg, PA (US);
Michael J. Daley, Canonsburg, PA (US);
Phillip Sean Stetson, Wexford, PA (US);
John M. Muza, Venetia, PA (US)

(73) Assignee: Robert Bosch GmbH, Stuttgart (DE)

( * ) Notice: Subject to any disclaimer, the term of this patent is extended or adjusted under 35 U.S.C. 154(b) by 390 days.

(21) Appl. No.: 13/161,194

(22) Filed: Jun. 15, 2011

(65) Prior Publication Data

US 2012/0319219 A1      Dec. 20, 2012

(51) Int. Cl.
*H01L 21/339*           (2006.01)

(52) U.S. Cl.
USPC ................ 438/166; 438/486; 257/415

(58) Field of Classification Search
USPC ............... 310/329; 257/415; 438/486, 166
See application file for complete search history.

(56) References Cited

U.S. PATENT DOCUMENTS

| | | | |
|---|---|---|---|
| 4,721,938 A | 1/1988 | Stevenson | |
| 4,816,125 A | 3/1989 | Muller et al. | |
| 6,012,335 A | 1/2000 | Bashir et al. | |
| 6,677,176 B2 | 1/2004 | Wong et al. | |
| 7,812,505 B2 * | 10/2010 | Lee et al. | 310/324 |
| 7,834,409 B2 | 11/2010 | Reichenbach et al. | |
| 2002/0034864 A1 * | 3/2002 | Mizushima et al. | 438/486 |
| 2004/0253760 A1 | 12/2004 | Zhang et al. | |
| 2006/0008098 A1 | 1/2006 | Tu | |
| 2006/0270088 A1 | 11/2006 | Fischer et al. | |
| 2008/0123242 A1 | 5/2008 | Zhou | |
| 2010/0187646 A1 | 7/2010 | Kok et al. | |

FOREIGN PATENT DOCUMENTS

WO       2009127455       10/2009

OTHER PUBLICATIONS

European Search Report for Application No. 12169041.6 dated Dec. 14, 2012 (5 pages).

* cited by examiner

*Primary Examiner* — Howard Weiss
*Assistant Examiner* — Steven Rao
(74) *Attorney, Agent, or Firm* — Michael Best & Friedrich LLP

(57) ABSTRACT

A method of manufacturing a microphone using epitaxially grown silicon. A monolithic wafer structure is provided. A wafer surface of the structure includes poly-crystalline silicon in a first horizontal region and mono-crystalline silicon in a second horizontal region surrounding a perimeter of the first horizontal region. A hybrid silicon layer is epitaxially deposited on the wafer surface. Portions of the hybrid silicon layer that contact the poly-crystalline silicon use the poly-crystalline silicon as a seed material and portions that contact the mono-crystalline silicon use the mono-crystalline silicon as a seed material. As such, the hybrid silicon layer includes both mono-crystalline silicon and poly-crystalline silicon in the same layer of the same wafer structure. A CMOS/membrane layer is then deposited on top of the hybrid silicon layer.

24 Claims, 6 Drawing Sheets

EPITAXIAL SILICON CMOS-MEMS MICROPHONES AND METHOD FOR MANUFACTURING

BACKGROUND

The present invention relates to generally microphones incorporating CMOS (complementary metal-oxide-semiconductor) and MEMS (microelectromechanical systems) technologies. A MEMS microphone generally includes a backplate formed within a silicon oxide layer and a membrane that moves above the backplate in response to acoustic pressures (i.e., sound). The backplate is formed by etching a cavity on the backside of the silicon wafer. According to this method, the thickness of the backplate is determined by the duration of the backside etching.

SUMMARY

It is difficult to ensure uniform thickness of the backplate when producing MEMS microphones using a time-controlled etching process. Therefore, in practice, the minimum thickness of the backplate is limited to the smallest size where the variation in thickness of the backplate caused by the time-controlled etching process will not affect the performance of the microphone. Such limitations affect the overall size of the MEMS microphone system. Furthermore, the thickness of the backplate limits the smallest possible size of vent holes in the backplate.

Embodiments of the invention provide a method of manufacturing a CMOS-MEMS microphone system using epitaxial silicon processes. By using epitaxial processes instead of time-controlled etching, the thickness of the backplate is more uniformly defined. The epitaxial processes are based on a sequence of deposition and microstructuring steps mainly from the frontside of the wafer. The epitaxial deposition is able to grow both poly-crystalline and mono-crystalline silicon simultaneously on the same wafer and even on the same wafer surface depending upon the type of seed material that is provided at the start of the deposition process.

In one embodiment, the invention provides a method of manufacturing a microphone system. A wafer surface of a monolithic wafer structure includes a first silicon type in a first horizontal region and a second silicon type in a second horizontal region surrounding a perimeter of the first horizontal region. A hybrid silicon layer is epitaxially deposited on the wafer surface. The hybrid silicon layer uses the first silicon type as a seed material in areas where the hybrid silicon layer contacts the first silicon type on the wafer surface and uses the second silicon type as a seed material in areas where the hybrid silicon layer contacts the second silicon type. The hybrid silicon layer acquires characteristics of the seed material such that, after epitaxial deposition, the areas of the hybrid silicon layer above the first horizontal region on the wafer surface include the first silicon type and the areas above the second horizontal region on the wafer surface include the second silicon type. A CMOS/membrane layer is then deposited monolithically on the hybrid silicon layer. The CMOS/membrane layer includes a membrane positioned above the first horizontal region. The membrane is supported by an oxide material.

In some embodiments, the first horizontal region of the wafer surface includes a two-dimensional array of indentations defining a plurality of locations of vent holes for the backplate of the microphone.

In another embodiment, the invention provides a method of forming a MEMS microphone system. The method includes depositing an oxide layer on a mono-crystalline silicon layer on a front side of a monolithic structure. A plurality of vent hole locations are etched partially through the oxide layer from the front side of the structure. A poly-crystalline silicon layer of substantially uniform thickness is then deposited on the oxide layer on the front side of the structure. The poly-crystalline silicon layer and the oxide layer are partially removed by etching from the front side of the structure to expose the mono-crystalline silicon layer outside of an area defining a location of a back cavity of the MEMS microphone. A hybrid silicon layer is then epitaxially deposited on the poly-crystalline silicon layer and the exposed area of the mono-crystalline silicone. The hybrid silicon layer includes polycrystalline silicon in areas where the hybrid silicon layer contacts the poly-crystalline silicon and mono-crystalline silicon in areas where the hybrid silicon layer contacts the mono-crystalline silicon layer. The hybrid silicon layer is formed so that the resulting structure is of substantially uniform thickness. A second oxide layer is then deposited on the hybrid silicon layer. A back cavity is etched through the mono-crystalline layer on the back side of the structure exposing the oxide layer in the back cavity. The oxide layer is then uniformly etched in the back cavity from the back side until the poly-crystalline layer is partially exposed in the plurality of vent hole locations. The remaining oxide layer is then used as a mask to etch vent holes through the poly-crystalline silicon layer and the poly-crystalline silicon of the hybrid silicon layer from the back side of the structure. The etching of the vent holes is stopped once the second oxide layer is exposed. This process leaves the second oxide layer wholly intact and the hybrid silicon layer intact in areas outside of the plurality of vent hole locations.

In some embodiments, a membrane is included inside the second oxide layer. The membrane is released by etching the second oxide layer above the membrane and removing a sacrificial layer between underneath the membrane. In some embodiments, the sacrificial layer includes the portion of the oxide layer underneath the membrane and within the area of the back cavity leaving the remaining portions of the poly-crystalline silicon layer and the first oxide layer outside of the vent hole locations as the backplate of the MEMS microphone. In some embodiments, the sacrificial layer includes a portion of the poly-crystalline silicon layer directly below the membrane. Only part of the poly-crystalline silicon layer is removed in the sacrificial etching process leaving at least a portion of the second oxide layer to move with the membrane and leaving a portion of the poly-crystalline silicon layer and the first oxide layer outside of the vent hole locations as the backplate of the MEMS microphone In another embodiment, the invention provides a CMOS-MEMS microphone including a membrane that moves in response to acoustic pressure and a CMOS integrated circuit in the same surface layer of the CMOS-MEMS microphone. The microphone also includes a backplate formed of poly-crystalline silicon and an oxide material. In some embodiments, the microphone is formed by epitaxially depositing a hybrid silicon layer wherein a portion of the layer inside of the back cavity is created using poly-crystalline silicon as a seed material and a portion of the layer outside of the back cavity is created using mono-silicon as a seed material.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Figure 1A:
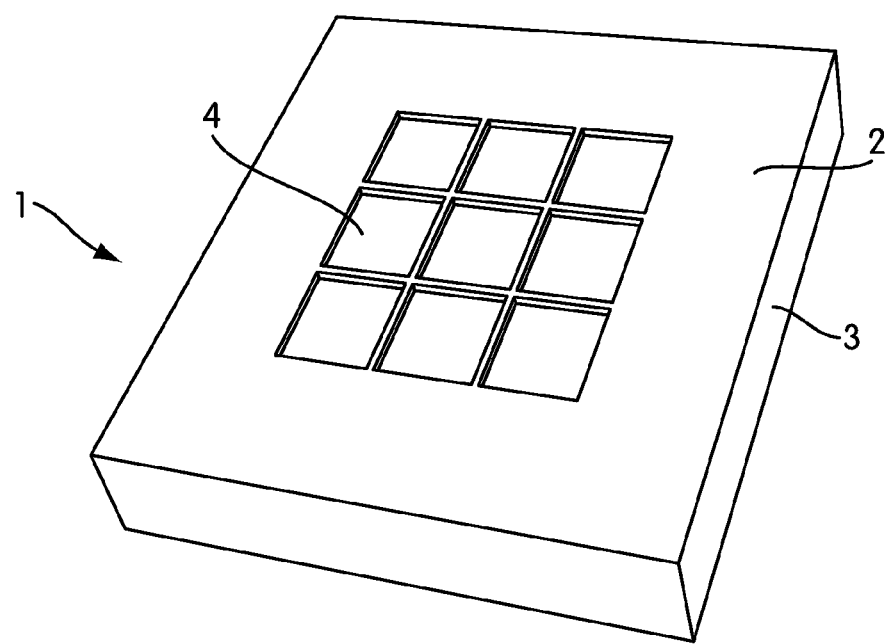
FIG. 1A is a perspective view of the top side of a CMOS-MEMS microphone according to one embodiment.
Figure 1B:
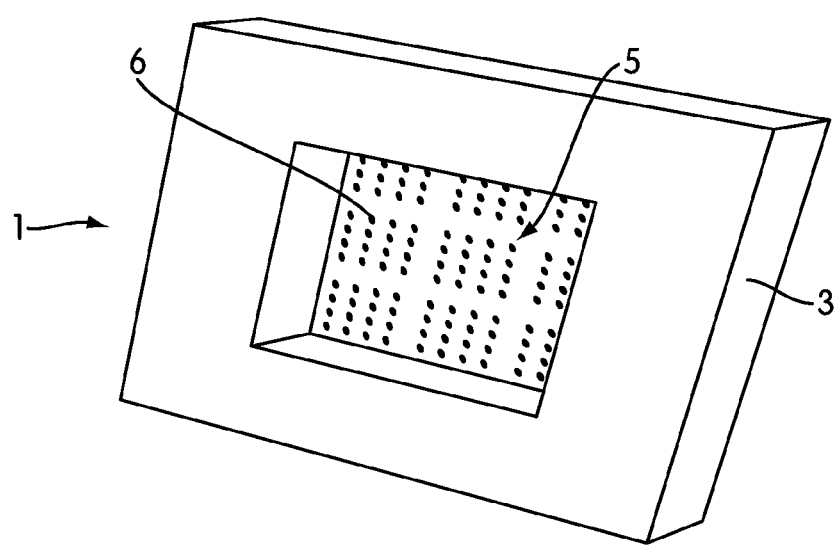
FIG. 1B is a perspective view of the bottom side of the CMOS-MEMS microphone of FIG. 1.

FIG. 1A illustrates the top surface of a CMOS-MEMS microphone structure 1. The microphone structure 1 includes an oxide/CMOS layer 2 on top of a silicon layer 3. A membrane or array of membranes 4 is positioned in the oxide CMOS layer 2. As shown in FIG. 1B, the back side of the microphone structure 1 includes a back cavity 5 etched into the silicon layer 3. At the top of the back cavity 5 is a back plate 6. When acoustic pressures (i.e., sound) are applied to the microphone 1, the membrane 4 moves relative to the backplate 6 and changes in capacitance between the membrane 4 and the backplate 6 are detected by the microphone 1.

In the illustrated example, the backplate 6 includes a plurality of vent holes positioned in a two-dimensional array. Because the membrane 4 is not perforated and has no vent holes, air moves in and out of the area between the membrane 4 and the backplate 6 through the vent holes of the backplate 6.

Figure 2A:
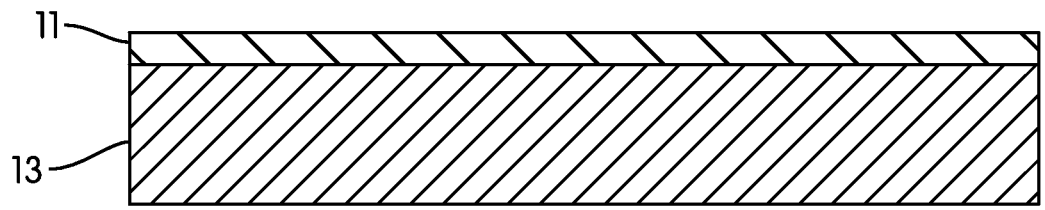
FIGS. 2A through 2H are vertical cross-sections of the CMOS-MEMS microphone of FIG. 1 at various stages during a manufacturing process.
Figure 2B:
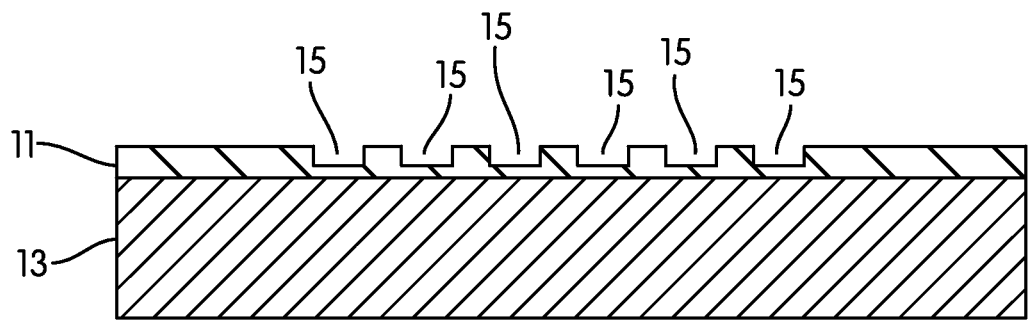

FIGS. 2A through 2H illustrate a process of creating the microphone structure 1 using epitaxial depositing techniques. In FIG. 2A, a thermal oxide layer 11 is grown on a standard p-type bulk-silicon wafer 13. The thermal oxide layer 11 is approximately 2.5 μm thick. The oxide layer could also be deposited using any appropriate deposition technology including low-pressure chemical vapor deposition (LPCVD) and plasma-enhanced chemical vapor deposition (PECVD). As shown in FIG. 2B, the oxide layer is etched to define the locations 15 of the backplate vent holes that will be etched later in the process. The locations 15 of the vent holes are defined using photoresist lithography and standard oxide etching techniques. Either wet-etching or plasma etching of the silicon oxide may be applied. The oxide layer 11 is not etched through completely in the locations 15 of the vent holes. In this example, the remaining oxide layer 11 in the locations 15 of the vent holes is less than half of the thickness of the original oxide layer 11.

Figure 2C:
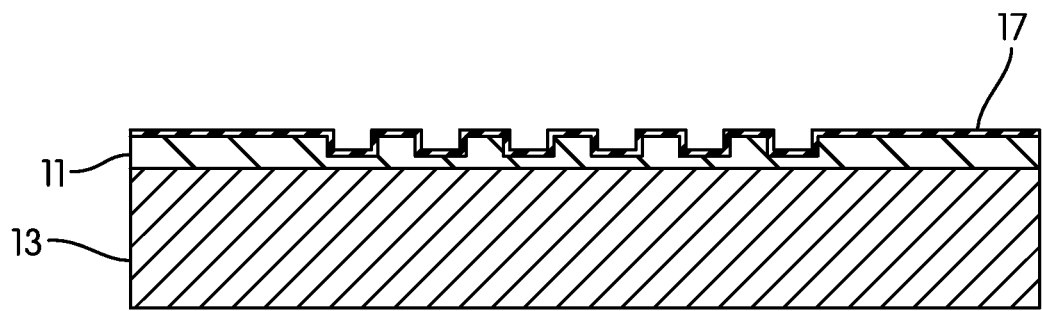

As shown in FIG. 2C a poly-crystalline silicon layer 17 is deposited onto the whole top surface of the wafer. The poly-crystalline silicon layer 17 is approximately 10-100 nanometers thick across the entire top surface. Because the oxide layer 11 has been etched to define the locations 15 of the backplate vent holes, the uniformly-thick poly-crystalline silicon layer 17 takes the structure and shape of the top surface of the oxide layer 11.

Figure 2D:
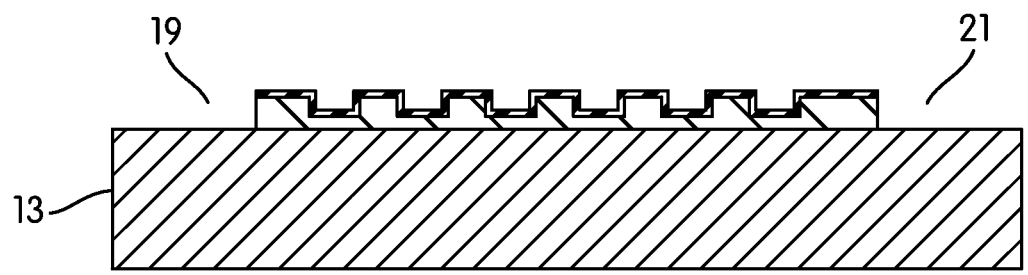

The process then defines the horizontal area of the back cavity and the MEMS microphone device by etching both the poly-crystalline silicon layer 17 and the oxide layer 11 as illustrated in FIG. 2D exposing the top surface of the mono-crystalline silicon layer 13. The poly-crystalline silicon 17 and the oxide 11 are only removed from the areas 19, 21 that will not form the back plate of the microphone. The poly-crystalline silicon is removed from the non-MEMS areas 19, 21 using photolithography and etching. Once the poly-crystalline silicon is removed from the non-MEMS areas 19, 21, the remaining poly-crystalline silicon layer 17 can be used as a mask for removing the oxide layer material from the non-MEMS areas 19, 21.

Figure 2E:
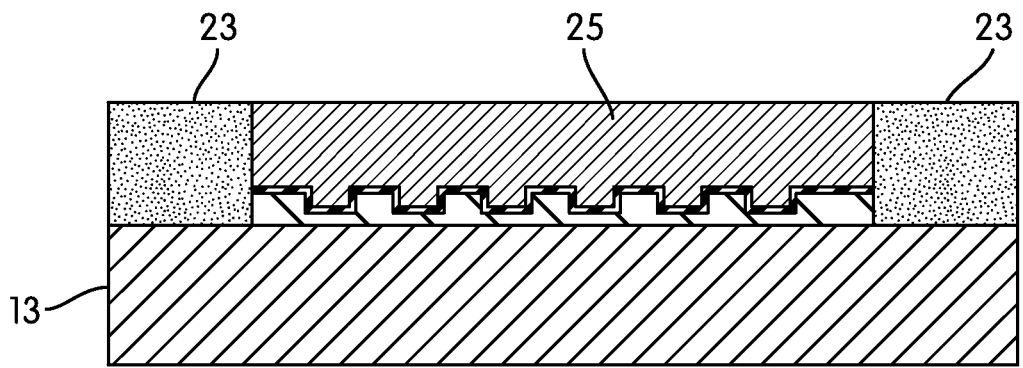

As shown in FIG. 2E, a thick epitaxial silicon layer is then deposited on top of the wafer. Epitaxial deposition is able to grow both poly-crystalline and mono-crystalline silicon simultaneously on the same surface of the wafer in the form of thinner or thicker layers depending upon the type of seed material provided at the start of the epitaxial deposition process. As such, the silicon in the epitaxial layer takes on the characteristics of the seed material contacting the bottom surface of the epitaxial layer. For example, where the epitaxial silicon layer contacts the mono-crystalline silicon layer 13, the epitaxial layer also grows as a mono-crystalline silicon 23. Conversely, the epitaxial silicon layer grows as a poly-crystalline silicon 25 where it contacts the poly-crystalline silicon layer 17. The result of this epitaxial silicon deposition is a hybrid silicon layer that that includes both mono-crystalline silicon and poly-crystalline silicon components 23 and 25, respectively.

Doping of the epitaxial silicon layer should conform to the CMOS or BiCMOS process which will be integrated monolithically with the MEMS microphone device. A low level of Boron (approximately $10^{15}$ cm$^{-3}$) should be present in the epitaxial silicon material leading to a specific resistance value on the order of 1 Ωcm in p-type mono-crystalline silicon region of the epitaxial silicon layer and a specific resistance on the order of 1000 Ωcm in the poly-crystalline silicon region. The epitaxial silicon layer is planarized using chemical-mechanical polishing (CMP) to reduce surface roughness in the poly-crystalline silicon areas in the regions required for high-resolution photolithography.

If the poly-crystalline region of the epitaxial silicon layer needs to be conductive—for example, to support CMOS processes or microphone control operations—it is doped to N$^+$ silicon material by masked ion implantation techniques. By using high speed dopant diffusion along grain-boundaries, the normal temperature for CMOS- or BiCMOS-processing is sufficient to homogeneously spread the dopant through the poly-crystalline region of the epitaxial silicon layer to the lower stopping oxide layer. After implantation, the poly-crystalline silicon surfaces are covered by silicon nitride by LPCVD-coating of the whole wafter with Si$_3$N$_4$. Subsequent structuring of the Si$_3$N$_4$ limits the deposition of silicon nitride to only the surfaces of the poly-crystalline silicon region of the epitaxial silicon layer. Because oxidation may adversely affect the mechanical performance of the poly-crystalline silicon material due to grain boundary diffusion of oxygen and oxidation of the grain-boundaries, the Si$_3$N$_4$ remains on the surface during processes where oxygen cannot be excluded such as thermal oxidation or thermal annealing. A field-oxide may be thermally grown on the top surface of the epitaxial silicon layer that is not covered with silicon nitride. After all high-temperature oxidation and annealing steps are completed and before starting any CMOS- or BiCMOS-backend processes, the silicon nitride is removed to directly expose the poly-crystalline silicon surface of the backplate.

Figure 2F:
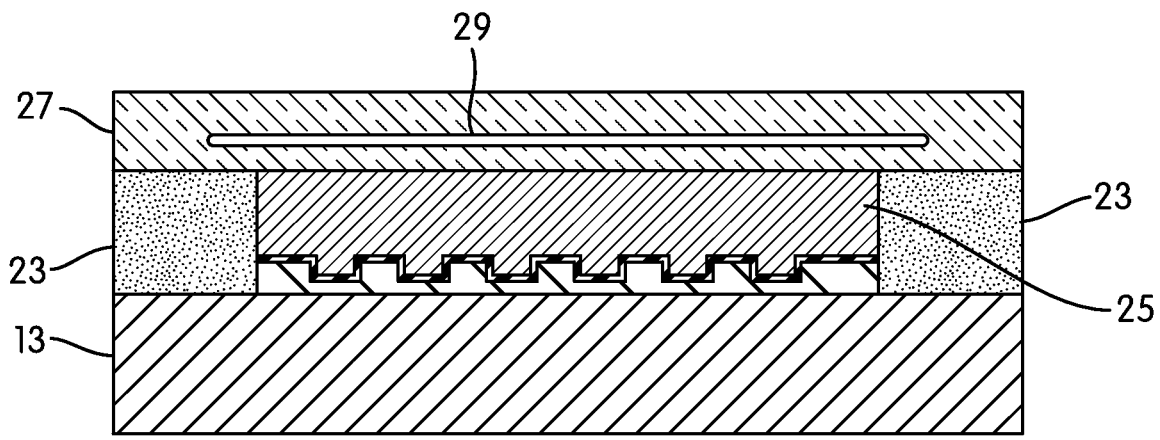

As shown in FIG. 2F, a CMOS-backend layer is then applied to the front surface of the hybrid epitaxial silicon layer. The CMOS layer includes a second oxide material 27 and a microphone membrane 29. The membrane 29 is designed to address the lateral geometry of the microphone system, stress-relaxation properties, mechanical stiffness, bow-reduction, and acoustic short-circuit characteristics. The membrane 29 may include a mesh pattern, supporting-beam, or slit-constructions along the perimeter of the membrane 29. The membrane 29 is structured for a combination of topside and backside release. However, as described below, the membrane may also be structured for release by only top-side or only back-side methods. In the example illustrated in FIG. 2F, the membrane 29 is not perforated in its inner part and will not need to be sealed after release of the sacrificial layer (described below).

The membrane 29 is designed also to address vertical layer stacking to achieve desired mechanical and electrical conductivity performance. In the example illustrated in FIG. 2F, the silicon oxide 27 below the membrane 29 may serve as an etching-stop or as an element of the sacrificial layer as described below.

Figure 2G:
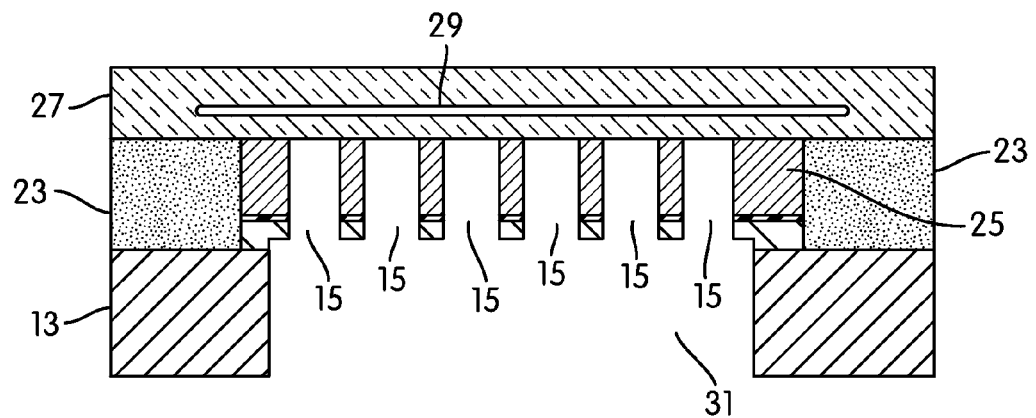

After the CMOS/membrane layer is applied, the backside cavity 31 of the microphone underneath the backplate is defined using deep reactive-ion etching (DRIE) as illustrated in FIG. 2G. The DRIE process stops at the lower oxide layer 11 (FIG. 2C) which separates the bulk-silicon 13 from the poly-crystalline silicon layer 17. The lower oxide layer 11 is then etched back to approximately half its original thickness. Because the locations of the back plate vent holes 15 (FIG. 2B) were already etched to half of the original thickness of the oxide layer 11, the poly-crystalline silicon 25 is exposed in locations of the back plate vent holes 15. Portions of the oxide layer 11 outside of the vent hole locations 15 remain after the etching process. The etching of the oxide layer 11 is performed using wet oxide etching in buffered HF-solution. Alternatively, the etching can be performed using dry oxide etching techniques in a plasma reactor. After the poly-crystalline silicon 25 is exposed in the vent hole locations 15, DRIE is again used to etch the poly-crystalline silicon 25 in each vent hole location 15 up to the second oxide layer 27, which acts as an etching stop.

Figure 2H:
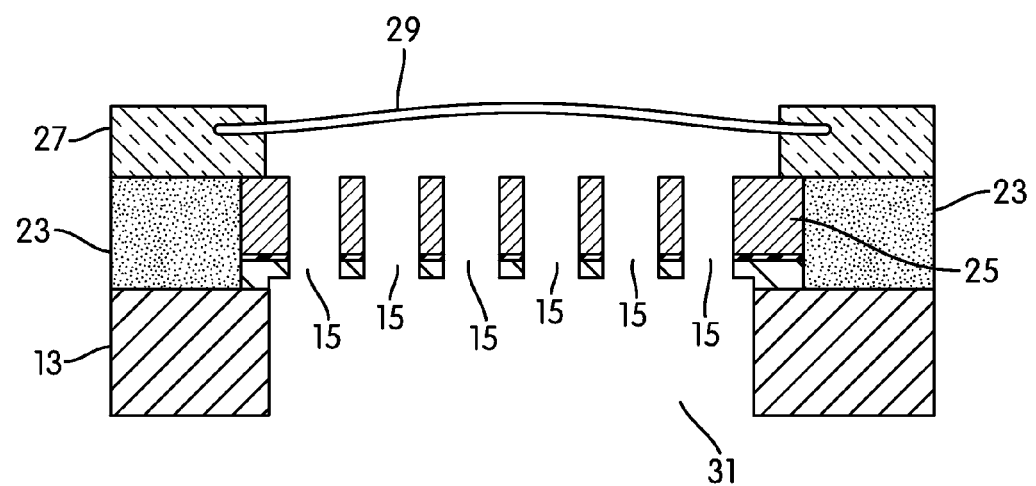

At the stage illustrated in FIG. 2G, the membrane 29 must be released from the upper oxide layer 29 and a gap must be defined between the membrane 29 and the backplate of the microphone. There are several options for releasing the membrane 29 and defining the gap. As illustrated in FIG. 2H, the oxide material 27 both below and above the membrane 29 is removed using a technique such as wet etching, HF-vapour phase etching, or isotropic oxide plasma etching. If the gap defined by removal of the sacrificial oxide 27 underneath the membrane 29 is sufficiently large to provide the required microphone functionality and performance, then the process may end at this stage. Alternatively, a portion of the poly-crystalline silicon 25 may also be removed to increase the cavity volume between the membrane 29 and the backplate of the microphone.

Figure 3A:
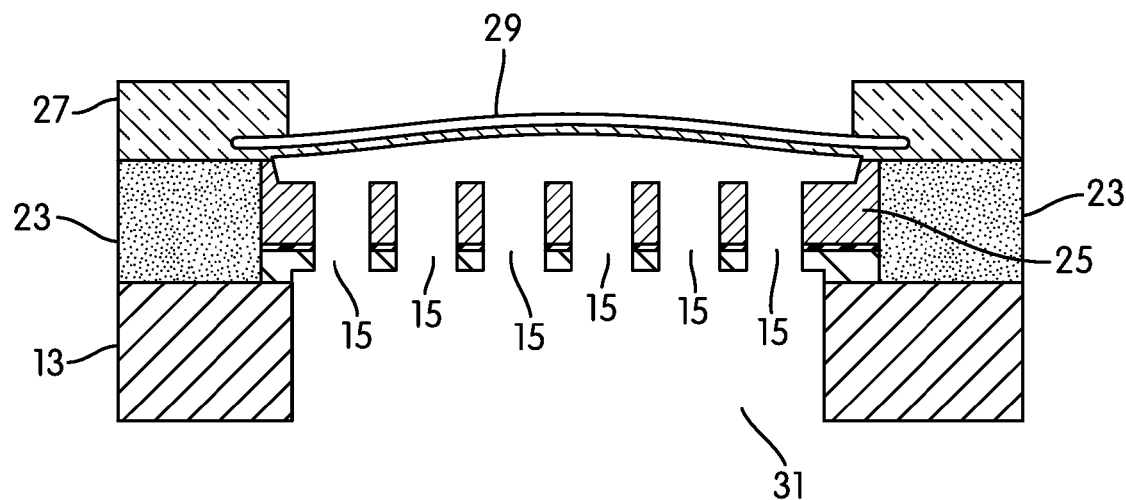
FIGS. 3A and 3B are vertical cross-sections illustrating alternative methods of releasing the microphone membrane of the CMOS-MEMS microphone of FIG. 1.

Alternatively, the poly-crystalline silicon 25 below the membrane 29 can be removed to define the cavity without removing the oxide below the membrane 29 as illustrated in FIG. 3A. The silicon sacrificial etching step is a time-controlled step removing some poly-crystalline silicon and increasing the gap width between the membrane 29 and the backplate of the microphone. In order to prevent the silicon etching from damaging the sidewalls of the vent holes 15, the sidewalls are passivated before the etching process by depositing a protective polymer from the backside of the wafer structure. The protective polymer may consist of cross-linked $(CF_2)_n$ chains. The silicon etching step then begins to under-etch the poly-crystalline silicon material 25 at the point where it contacts the oxide layer 27. After the sacrificial etching of the poly-crystalline silicon material 25, the membrane is released by partially removing the oxide layer 27 using hydrofluoric acid.

The passivation layer on the sidewalls of the vent holes 15 can be removed by utilizing the DRIE notching-effect. When using DRIE processes in narrow trenches, such as the vent holes 15, a normally unwanted notching effect is created at dielectric etch-stops. Therefore, most DRIE processes include counter-measures to prevent such notching. However, by removing the notch-suppression in the DRIE process, a charging effect occurs at the interface region between the silicon of the backplate and the passivation layer causing the sidewall passivation layer to break apart.

A similar notch-effect process can also be used to increase the gap between the poly-crystalline silicon material 25 and the oxide layer 27. Again, charging at the interface between the two layers drives notches deeper along the interface and increases the gap between the membrane 29 and the backplate. Alternatively, after breaking through the sidewall passivation by using the DRIE notching-effect, further sacrificial etching of the poly-crystalline silicon below the oxide layer 27 can be performed using a different etching technique, such as, for example, $XeF_2$ etching, $ClF_3$ etching, or isotropic $SF_6$ plasma etching.

Figure 3B:
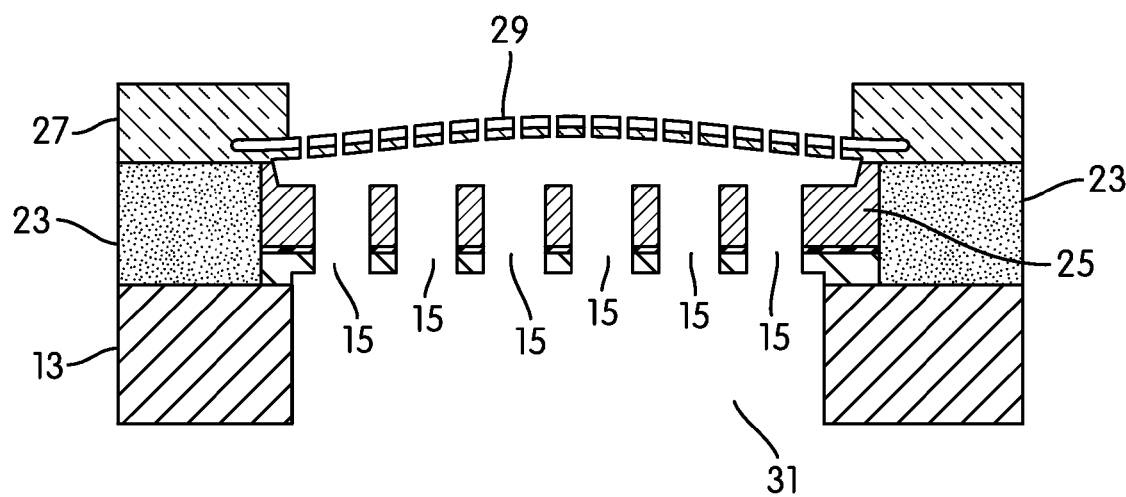

Another alternative method for releasing the membrane 29 is illustrated in FIG. 3B. If the membrane 29 includes openings across its surface (e.g., to control low frequency performance) a topside directional oxide etch and an isotropic silicon release process can be used to release the membrane 29 and the oxide layer 27 from the poly-crystalline silicon material 25.

In the examples above, the two electrodes of the microphone are referred to as a membrane and a backplate. The backplate is a stationary electrode and does not move during operation. The membrane responds to acoustic waves by moving relative to the backplate. Although the examples illustrated above show the backplate positioned below the membrane, in other embodiments, the orientation of the backplate and the membrane may be reversed such that the backplate is positioned above the membrane.

Thus, the invention provides, among other things, a method of manufacturing a microphone using epitaxial silicon deposition instead of primarily relying upon timed etching processes. Various features and advantages of the invention are set forth in the following claims.

What is claimed is:

1. A method of manufacturing a microphone, the method comprising:
    providing a monolithic wafer structure including a wafer surface, the wafer surface including a first silicon type on the wafer surface in a first horizontal region and a second silicon type on the wafer surface in a second horizontal region surrounding a perimeter of the first horizontal region;
    epitaxially depositing a hybrid silicon layer monolithically on the wafer surface,
        the first silicon type acts as a seed material in areas where the hybrid silicon layer contacts the first silicon type on the wafer surface, the second silicon type acts as a seed material in areas where the hybrid silicon layer contacts the second silicon type on the wafer surface, and the hybrid silicon layer acquires characteristics of the seed material such that, after epitaxial deposition, the areas of the hybrid silicon layer above the first horizontal region on the wafer surface include the first silicon type and the areas above the second horizontal region on the wafer surface include the second silicon type; and
    depositing a CMOS/membrane layer monolithically on the hybrid silicon layer, the CMOS/membrane layer including a membrane positioned above the first horizontal region on the wafer surface, the membrane being supported by an oxide material.

2. The method of claim 1, wherein providing the monolithic wafer structure includes providing a wafer surface including a plurality of indentations in the first horizontal region defining a plurality of locations of vent holes for a backplate of the microphone.

3. The method of claim 2, wherein the plurality of indentations in the first horizontal region are provided in a two-dimensional array.

4. The method of claim 1, wherein providing the monolithic wafer structure includes providing a wafer surface wherein the first silicon type includes poly-crystalline silicon and the second silicon type includes mono-crystalline silicon.

5. The method of claim 4, wherein providing the monolithic wafer structure includes:
providing a layer of mono-crystalline silicon;
depositing a first oxide layer on the layer of mono-crystalline silicon;
etching a plurality of indentations partially through the first oxide layer, the plurality of indentations defining locations of a plurality of vent holes for a backplate of the microphone;
depositing a layer of poly-crystalline silicon on the first oxide layer; and
removing portions of the layer of poly-crystalline silicon and the first oxide layer from the second horizontal region of the wafer surface, thereby exposing the layer of mono-crystalline silicon in the second horizontal region.

6. The method of claim 5, wherein epitaxially depositing the hybrid silicon layer monolithically on the wafer surface includes depositing the hybrid silicon layer so that an overall thickness of the monolithic wafer structure in the first horizontal region is substantially equal to an overall thickness of the monolithic wafer structure in the second horizontal region.

7. The method of claim 5, further comprising defining a back cavity of the microphone by removing a portion of the layer of mono-crystalline silicon in the first horizontal region from a bottom wafer surface until the first oxide layer is exposed on the bottom wafer surface.

8. The method of claim 7, further comprising defining the plurality of vent holes by:
removing a portion of the first oxide layer in the back cavity of the microphone from the bottom wafer surface until poly-crystalline silicon is exposed in the plurality of indentations; and
removing poly-crystalline silicon in the plurality of indentations until the CMOS/membrane layer is exposed on the bottom wafer surface.

9. The method of claim 8, further comprising defining a cavity between the membrane and the backplate of the microphone.

10. The method of claim 9, wherein defining the cavity between the membrane and the backplate of the microphone includes removing a portion of the poly-crystalline silicon through the vent holes beginning where the poly-crystalline silicon contacts the CMOS/membrane layer.

11. The method of claim 9, wherein the CMOS/membrane layer includes oxide material below the membrane, and wherein defining the cavity between the membrane and the backplate of the microphone includes removing a portion of the oxide material below the membrane through the vent holes.

12. The method of claim 1, wherein a top surface of the membrane in the CMOS/membrane layer are covered with oxide material.

13. The method of claim 12, further comprising releasing the membrane by removing the oxide material adjacent to the membrane.

14. A method of forming a MEMS microphone, the method comprising:
depositing an oxide layer on a mono-crystalline silicon layer on a top surface of a monolithic structure;
etching a plurality of vent hole locations partially through the oxide layer from the top surface of the monolithic structure;
depositing a poly-crystalline silicon layer of a substantially uniform thickness on the oxide layer on the top surface of the monolithic structure;
etching the poly-crystalline silicon layer and the oxide layer from the top surface around a perimeter of the monolithic structure to expose the mono-crystalline silicon layer;
epitaxially depositing a hybrid silicon layer on the poly-crystalline silicon layer and the exposed area of the mono-crystalline silicon layer on the top surface of the monolithic structure,
the hybrid silicon layer acquiring characteristics of a seed material, wherein the seed material is poly-crystalline silicon in areas where the hybrid silicon layer contacts the poly-crystalline silicon layer and the seed material is mono-crystalline silicon in areas where the hybrid silicon layer contacts the mono-crystalline silicon layer,
the hybrid silicon layer being formed such that the monolithic structure has a substantially uniform thickness after the hybrid silicon layer is deposited;
depositing a second oxide layer on the hybrid silicon layer on the top surface of the monolithic structure;
etching a back cavity through the mono-crystalline silicon layer on a bottom surface of the monolithic structure exposing the oxide layer in the back cavity;
etching the oxide layer in the back cavity from the bottom surface of the monolithic structure until the poly-crystalline silicon layer is partially exposed in the back cavity in the plurality of vent hole locations; and
creating a plurality of vent holes in the plurality of vent hole locations using the remaining oxide layer as a mask by etching the poly-crystalline silicon layer and the poly-crystalline silicon of the hybrid silicon layer from the bottom surface of the monolithic structure until the second oxide layer is exposed leaving the oxide layer and the hybrid silicon layer intact in areas outside of the plurality of vent hole locations.

15. The method of claim 14, wherein etching the plurality of vent hole locations includes etching the plurality of vent hole locations in a two-dimensional array within a region of the monolithic structure that will include the back cavity of the MEMS microphone.

16. The method of claim 14, wherein depositing the second oxide layer includes depositing the second oxide layer including a microphone membrane.

17. The method of claim 16, further comprising defining a gap between the microphone membrane and a backplate of the MEMS microphone.

18. The method of claim 17, wherein defining the gap between the microphone membrane and the backplate of the MEMS microphone includes removing a portion of the poly-crystalline silicon through the vent holes beginning where the poly-crystalline silicon contacts the second oxide layer.

19. The method of claim 17, wherein defining the gap between the microphone membrane and the backplate of the MEMS microphone includes
performing DRIE etching without notch-effect suppression, and
generating a notch between the microphone membrane and the backplate caused by DRIE notch-effect.

20. The method of claim 17, wherein the second oxide layer includes oxide material below the microphone membrane, and wherein defining the cavity between the microphone membrane and the backplate of the MEMS microphone includes removing oxide material below the microphone membrane through the vent holes.

21. The method of claim 14, wherein depositing the second oxide layer includes depositing the second oxide layer including a microphone membrane with oxide material above the microphone membrane, the method further comprising releasing the microphone membrane by removing the oxide material above the microphone membrane.

22. A microphone comprising:
a back cavity formed in a first layer of a first silicon type;
a hybrid layer positioned monolithically on the first layer, the hybrid layer including a microphone backplate of a second silicon type surrounded by a perimeter of the first silicon type, the hybrid layer begin formed as a single silicon layer in a monolithic microphone structure, the microphone backplate including a plurality of vent holes; and
a CMOS/membrane layer including
a non-perforated microphone membrane positioned above the microphone backplate, and
a CMOS-backend system positioned above the perimeter of the first silicon type and supporting the non-perforated microphone membrane.

23. The microphone of claim 22, wherein the microphone backplate further comprises an oxide layer at the bottom of the microphone backplate above the back cavity, wherein the oxide layer is perforated at the plurality of vent holes.

24. The microphone of claim 22, wherein the first silicon type includes mono-crystalline silicon and the second silicon type includes poly-crystalline silicon.

* * * * *